(12) United States Patent
Sandino et al.

(10) Patent No.: US 11,125,846 B2
(45) Date of Patent: Sep. 21, 2021

(54) METHOD FOR CORRECTION OF PHASE-CONTRAST MAGNETIC RESONANCE IMAGING DATA USING A NEURAL NETWORK

(71) Applicant: The Board of Trustees of the Leland Stanford Junior University, Stanford, CA (US)

(72) Inventors: Christopher Michael Sandino, Menlo Park, CA (US); Shreyas S. Vasanawala, Stanford, CA (US); Joseph Yitan Cheng, Santa Clara, CA (US); Jiacheng Jason He, Mountain View, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 71 days.

(21) Appl. No.: 16/826,157

(22) Filed: Mar. 20, 2020

(65) Prior Publication Data

US 2020/0300955 A1    Sep. 24, 2020

Related U.S. Application Data

(60) Provisional application No. 62/821,559, filed on Mar. 21, 2019.

(51) Int. Cl.
*G01R 33/563* (2006.01)
*G01R 33/56* (2006.01)

(52) U.S. Cl.
CPC ... *G01R 33/56316* (2013.01); *G01R 33/5608* (2013.01)

(58) Field of Classification Search
CPC ............... G01R 33/5608; G01R 33/56316
See application file for complete search history.

(56) References Cited

U.S. PATENT DOCUMENTS

| | | | |
|---|---|---|---|
| 7,682,311 B2 | 3/2010 | Simopoulos | |
| 9,689,949 B2 | 6/2017 | Gulsun | |
| 9,897,433 B2 | 2/2018 | Liu | |
| 9,964,640 B2 | 5/2018 | Lucas | |
| 2006/0066306 A1* | 3/2006 | Mistretta | G01R 33/56308 324/309 |
| 2015/0362575 A1* | 12/2015 | Ourselin | G01R 33/5616 382/131 |
| 2018/0203087 A1 | 7/2018 | Ye | |
| 2019/0302210 A1* | 10/2019 | Epstein | G01R 33/56316 |

* cited by examiner

*Primary Examiner* — Gregory H Curran
(74) *Attorney, Agent, or Firm* — Lumen Patent Firm

(57) ABSTRACT

A method is disclosed for phase contrast magnetic resonance imaging (MRI) comprising: acquiring phase contrast 3D spatiotemporal MRI image data; inputting the 3D spatiotemporal MRI image data to a three-dimensional spatiotemporal convolutional neural network to produce a phase unwrapping estimate; generating from the phase unwrapping estimate an integer number of wraps per pixel; and combining the integer number of wraps per pixel with the phase contrast 3D spatiotemporal MRI image data to produce final output.

1 Claim, 3 Drawing Sheets

METHOD FOR CORRECTION OF PHASE-CONTRAST MAGNETIC RESONANCE IMAGING DATA USING A NEURAL NETWORK

CROSS-REFERENCE TO RELATED APPLICATIONS

This application claims priority from U.S. Provisional Patent Application 62/821559 filed Mar. 21, 2019, which is incorporated herein by reference.

STATEMENT REGARDING FEDERALLY SPONSORED RESEARCH OR DEVELOPMENT

This invention was made with Government support under contracts EB026136 and EB009690 awarded by the National Institutes of Health. The Government has certain rights in the invention.

FIELD OF THE INVENTION

The present invention relates generally to methods for magnetic resonance imaging (MRI). More specifically, it relates to methods for phase-contrast magnetic resonance imaging (MRI).

BACKGROUND OF THE INVENTION

Phase-contrast magnetic resonance imaging (MRI) encodes tissue velocity information into the phase of the acquired image data, allowing for accurate quantification of blood flow for a variety of clinical applications.

Specifically, cardiac 4D flow MRI enables retrospective valve tracking, velocity profiling, and advanced flow pattern visualization. These evaluation techniques are used to identify symptoms of valvular heart disease, such as stenoses and regurgitation, and congenital heart disease, including shunting between regions of the heart.

At the time of acquisition, the velocity encoding parameter, $v_{enc}$, is set, which determines the maximum velocity encoded in the phase, ranging from $-\pi$ to $\pi$. Any velocities that exceed the $v_{enc}$ will wrap and alias. Mismapped velocities can result in artifactual reversal of the flow vectors, making it difficult to accurately measure blood flow [6]. A common clinical strategy is to preemptively overestimate the $v_{enc}$ to prevent aliasing; however, there is an inverse relationship between $v_{enc}$ and velocity-to-noise ratio (VNR). A robust phase unwrapping algorithm would allow clinicians to choose a low $v_{enc}$ and obtain useable images with high dynamic range and VNR.

The phase aliasing problem is not unique to MRI nor an unexplored problem. As described in [7], existing approaches vary in dimensionality, application, and approach. The large majority of approaches are 2D, since many other applications of phase unwrapping only require 2D data. Whether mathematical or deep learning-based, 2D approaches do not account for spatiotemporal correlations found in phase-contrast MRI.

Additionally, phase unwrapping algorithms from other fields do not generalize or translate well to phase-contrast MRI applications because they do not account for MRI-specific knowledge [1-3, 8-9]. Meanwhile, existing MRI-based techniques fail to provide a robust solution accounting for both spatial and temporal dimensions [4-5, 10-21].

BRIEF SUMMARY OF THE INVENTION

This description discloses a deep learning-based phase unwrapping model to correct for phase aliasing. It exploits spatiotemporal correlations unique to phase-contrast MRI data, trained only on data with simulated phase aliasing.

A first model uses 3D convolutions to examine performance on both retrospectively and prospectively acquired phase aliased data, and is then extended to a (2+1)D with separated convolutions to demonstrate increased efficiency without noticeable performance loss. Both networks are compared with a state-of-the-art single-step Laplacian approach A major challenge with a deep learning-based approach is the run-time efficiency. 4D flow MRI scans can produce up to 30,000 velocity images per exam. Therefore, an unwrapping approach needs to run efficiently in order to process all velocity images within a clinically feasible timeframe. To address this challenge, the present technique includes the following features:

A three-dimensional deep spatiotemporal phase unwrapping model that efficiently generates corrected velocity maps, We utilize the generated velocity maps to calculate the integer number of wraps for each slice and produce the unwrapped output, A training procedure during which the network is shown images with simulated low $v_{enc}$ values, through which the network learns to correct for aliasing.

In one aspect, the invention provides a method for phase contrast magnetic resonance imaging (MRI), the method comprising: acquiring 3D phase contrast spatiotemporal MRI image data; inputting the 3D spatiotemporal MRI image data to a three-dimensional spatiotemporal convolutional neural network to produce a phase unwrapping estimate; generating from the phase unwrapping estimate an integer number of wraps per pixel; and combining the integer number of wraps per pixel with the phase contrast 3D spatiotemporal MRI image data to produce final output.

DETAILED DESCRIPTION OF THE INVENTION

According to one embodiment, the method feeds a 3D phase input (x, y, time) into a neural network, which produces an unwrapped estimate. The input is subtracted from the estimate, and the difference is rounded, thus calculating the integer number of wraps per pixel. Finally, this number of wraps is added back to the input to produce the final output.

Figure 1:
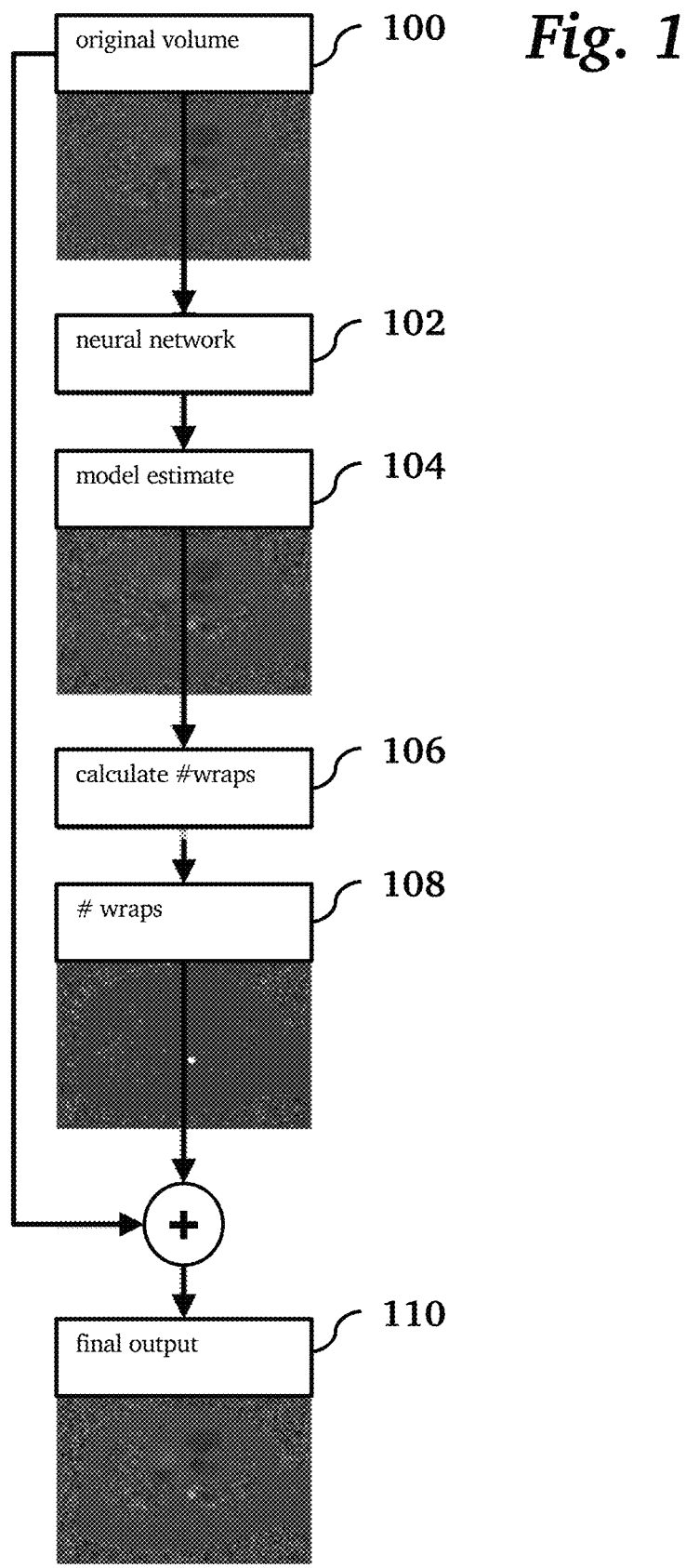
FIG. 1. Flowchart demonstrating a processing pipeline for an embodiment of the present invention. Because the number of wraps should be an integer value, the neural network output is used to calculate that integer number of wraps, which is added to the original input.

As an example implementation of this technique, as shown in FIG. 1, original 3D spatiotemporal MRI data 100 is input to a neural network 102 which outputs a model estimate 104. The estimate 104 is used to calculate in step 106 an integer number of wraps per pixel 108, which is then combined with the original data 100 to produce final unwrapped output 110.

The neural network is trained on four-dimensional (4D) flow data and achieved efficient performance. With IRB approval, cardiac 4D flow data for nine patients were acquired with a contrast-enhanced velocity-encoded volumetric RF-spoiled gradient echo sequence and a high $v_{enc}$ of 250 cm/s. Seven datasets were used for training, one for validation, and one for testing. Additional low $v_{enc}$ data were later added for testing purposes. Velocity was calculated in three directions with a four-point velocity encoding scheme, and phase wrapping was retrospectively simulated into the data, with $v_{enc}$ values between 25 cm/s and 75 cm/s. Each set had between 200 and 240 slices along the axial axis, but only the top third with the most velocity changes were chosen to eliminate slices that primarily have static tissue. Datasets are split by slice and direction, resulting in 1,581 unique training examples. During training, to minimize the amount of noise seen by the model, the images were randomly cropped into patches in the spatial domain, to five percent of the original size. Patches were chosen using the magnitude image as the probability density function because the contrast enhanced blood typically maps to regions with higher velocities. Background regions, air, contain uniformly distributed phase $[-\pi, \pi]$, which are not useful for the network to learn properly. During validation and testing, the data was not patched to evaluate performance on full images.

Figure 2:
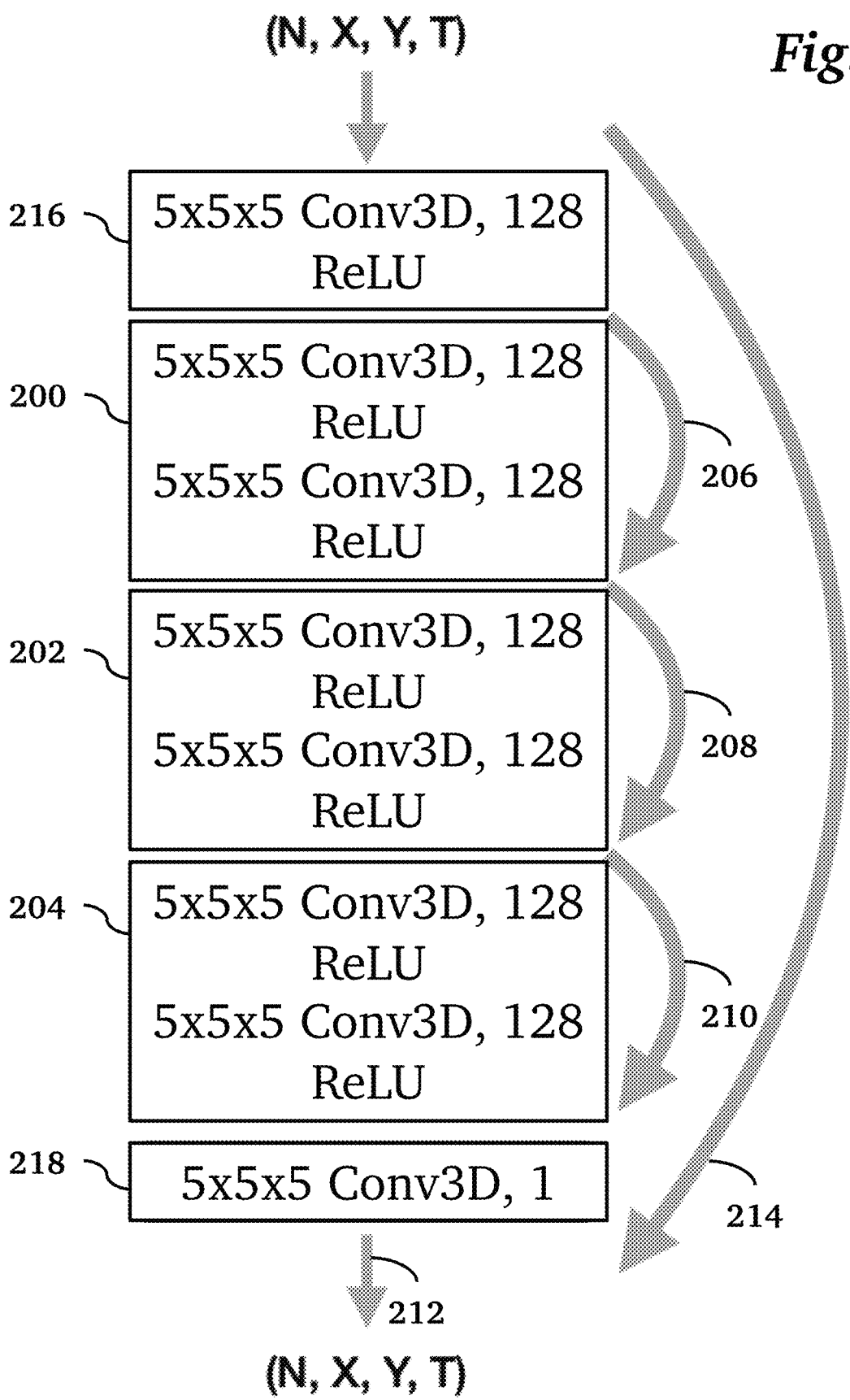
FIG. 2. The neural network architecture including three-dimensional residual learning blocks, according to an embodiment of the invention. Each block has two convolution layer and rectified linear unit pairs. The convolutions were padded to preserve the x- and y-dimension sizes.

The network architecture is shown in FIG. 2. The network has three residual learning blocks 200, 202, 204 [22], which use residual connections 206, 208, 210 between convolutional layer pairs to expedite training convergence and mitigate vanishing gradient issues. The network generates an estimated velocity map 212, from which the input 214 is subtracted.

The difference is rounded because the number of wraps must be an integer value, and that quantity is added to the input to produce the final unwrapped output.

For run-time efficiency, three-dimensional convolutions are converted to pairs of two-dimensional and one-dimensional convolutions: one in the spatial domain and one in the temporal domain. Lower dimensional convolutions are better optimized in deep learning frameworks; this method sped up the inference time by 91.5%.

The neural network was designed after the Off-ResNet architecture, an intentionally shallow architecture with a large kernel, designed to learn regional correlations well without overfitting to specific anatomical structures. 3D data (x, y, time) is fed into the network, producing an unwrapped estimate. The input is then subtracted from the network output and rounded, producing the integer number of wraps per pixel.

Two networks were trained—one with 3D convolutions and one with 2D convolutions. Training data includes data from scans of 7 patients and was acquired without phase aliasing. During training, randomized phase aliasing was simulated into the data, and images were cropped based on the magnitude images, to focus on regions with higher likelihood of aliasing. Both networks were evaluated with a retrospectively aliased test dataset, as well as prospectively acquired data. The results of both networks were compared with a state-of-the-art non-deep learning-based Laplacian approach. Results were evaluated with normalized root-mean-square error (NRMSE), structural similarity index (SSIM), and peak signal-to-noise ratio (PSNR).

The two convolutional neural networks are based on the Off-ResNet architecture. The Off-ResNet architecture first uses a single convolution layer 216, followed by three residual layers 200, 202, 204, and one final output convolution layer 218. All convolution layers are 3D convolutions with a 5×5×5 kernel and 128 filters, and each convolution is followed by a rectified linear activation unit (ReLU) besides the output layer. The Off-ResNet architecture is intentionally shallow, relative to other popular network architectures, to preserve generalizability and avoid overfitting to specific anatomies. We modified the architecture to only input phase information, instead of complex inputs in the original design. We experimented with adding magnitude information inputs but did not see a major impact on the results. We preserved the relatively large kernel size in our network, since we wanted the network to identify the spatial correlations over larger regions and not just correlate spatially adjacent pixels.

For the first network we used 3D convolution layers, similar to the Off-ResNet design, but for the second network, we separated each 3D convolution into a 2D spatial convolution and a 1D temporal convolution. While we expected the decrease in parameters to affect performance, we hypothesized it could potentially help with increased generalizability and reduce risk of overfitting.

Dataset & Training

For training and retrospective evaluation, we acquired cardiac 4D flow data for nine patients with a high $v_{enc}$ of 250 cm s$^{-1}$. With IRB approval, we used a contrast-enhanced velocity-encoded volumetric RF-spoiled gradient echo sequence on a 1.5 T scanner (GE) and reconstructed the data. Seven of the high $v_{enc}$ datasets were used for training, one for validation, and one for testing. For prospective evaluation, the same sequence used to acquire the training, validation, and test data was also used to sequentially acquire two paired high venc/low venc datasets from the same patient. Velocity was calculated in three directions—anterior-posterior, right-left, and superior-inferior—with a four-point velocity encoding scheme.

During training, we mixed axial data from all three velocity-encoding directions, in hopes our model could generally learn the features of phase wrapped data, agnostic to direction. We retrospectively simulated phase wrapping into the data by applying Eq. 1, where $\varphi_H$ is high $v_{enc}$ data, $\varphi_L$ is simulated low $v_{enc}$ data, and $v_{enc,L}$ is the new lower maximum velocity to encode in the data. We randomly generated $v_{enc,L}$ to be between 25 cm s$^{-1}$ and 75 cm s$^{-1}$ during training to augment and increase our dataset. This range was heuristically determined based on the low velocities of interest in cardiac 4D flow studies, but other ranges could be selected for other applications.

$$\varphi_L = \varphi_H - 2\, v_{enc,L} \lfloor \varphi_H / 2v_{enc,L} + \tfrac{1}{2} \rfloor \qquad \text{Eq. 1}$$

Because there were far more non-wrapped pixels than wrapped pixels, we balanced the dataset by filtering and cropping slices. One-third of the slices of each patient were selected, by choosing the slices with the top standard deviation of the average velocity over the cardiac phase. This eliminated slices with very little change in velocity, such as slices at the top and bottom that consisted primarily of cardiac muscle tissue, rather than blood flow. After filtering through the slices, our training set consisted of 1,640 slices.

Slices were cropped in the spatial domain for the network to focus on a smaller region. We chose the center of the cropped region with the magnitude image as the probability density function, since the contrast-enhanced blood had the highest magnitudes, so regions with blood flow had a higher chance of being selected. By using this magnitude-weighted stochastic cropping, the network spent less time on purely noise inputs, which are found in anatomies filled with air in axial 4D flow data.

We trained both networks for 1,000 epochs. The 3D network trained for 112.74 hours, while the (2+1)D network trained for 32.48 hours. Both networks used an L2 loss and were optimized with RMSprop optimizer, to avoid vanishing and exploding gradients.

Evaluation

We evaluated both neural network models on retrospectively aliased test data and prospectively acquired high $v_{enc}$-low $v_{enc}$ paired data. We acquired the retrospective test data with a $v_{enc}$ of 250 cm s$^{-1}$ and wrapped it down to 25 cm s$^{-1}$, 50 cm s$^{-1}$, and 75 cm s$^{-1}$, to test both networks on a similar task as the training data. We also ran the retrospective test data through a state-of-the-art single-step Laplacian approach for comparison. All outputs were compared with the ground truth non-wrapped phase data with normalized root-mean-square error (NRMSE), structural similarity index (SSIM), and peak signal-to-noise ratio (PSNR). Additionally, we manually segmented select vessels to compare average flow over time.

We also evaluated both networks against the baseline Laplacian method on prospectively acquired paired data. The $v_{enc}$ data was run through all three approaches and compared with the high-$v_{enc}$ data.

Applications

This invention can be used for any and all MRI scans with relevant information encoded into the phase of the MRI signal. From a dimensionality perspective, this method can be useful for two-dimensional cine phase-contrast MRI, displacement encoding (DENSE) MRI, four-dimensional cardiac flow MRI, and any other phase-based data with x-, y-, and time dimensions. From an anatomy perspective, although the network is trained on only axial cardiac data, this technique can generalize to other anatomies and scan planes if provided sufficient training data.

Our technique can also extend to non-MRI applications, since the network can learn spatiotemporal correlations unique to the application.

Figure 3:
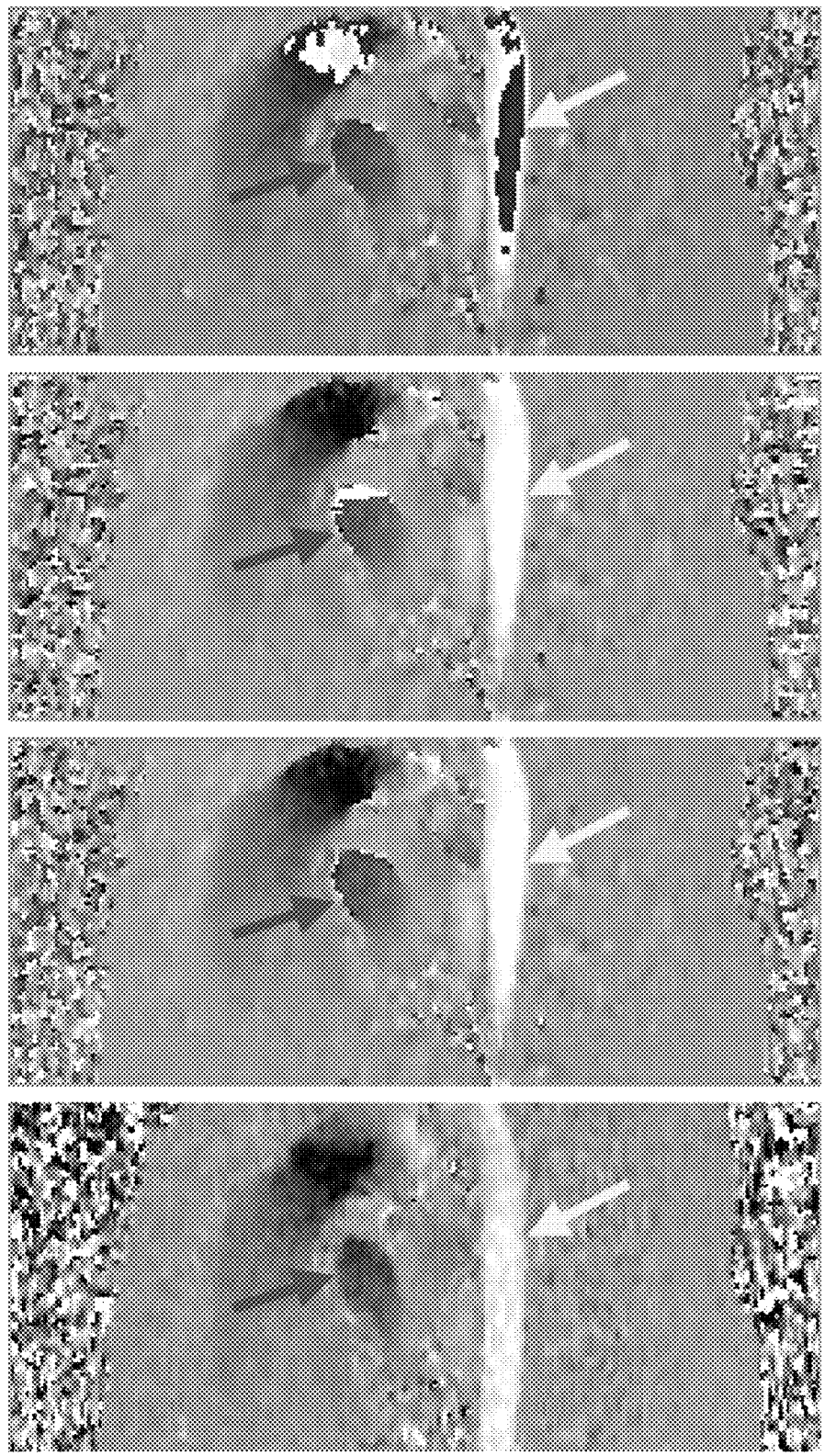
FIG. 3. Images illustrating results of the techniques of the present invention. From top to bottom: original low $v_{enc}$ data, output of algorithm in [14], output of our present method, high $v_{enc}$ data. Both algorithms successfully unwrapped pixels in the descending aorta (white arrow), while the present technique performed better in the aortic valve (grey arrow).

In comparison with traditional spatial phase unwrapping algorithms, the present invention can leverage previous MRI exam data to automatically learn to robustly perform phase unwrapping. Multi-dimensional phase unwrapping problems are ill-conditioned [23] causing traditional algorithms to become unstable when wrapping artifacts are severe. Our technique learns domain-specific correlations from training data to produce a robust unwrapping algorithm that is able to overcome solution instability. We show this in FIG. 3 by comparing our method with one of the state-of-the-art optimization-based algorithms, on a dataset initially acquired with a low $v_{enc}$ of 80 cm/s. In comparison with an existing deep phase unwrapping technique [11], our technique takes into account the temporal dynamics.

It will be appreciated by those skilled in the art that the embodiments described above include many specifics for the purposes of illustration only, and that these details may be varied without departing from the principles of the invention as taught herein. For example, the training may include various loss functions, including SSIM, l2 norm, l1 norm, and regularized combinations, all to tune performance.

This technique can be modified to include different neural network layers, blocks, and architectures. This can include modifications to individual layers, including using circular or symmetric convolutions instead of zero-padded convolutions; or incorporation of established neural network blocks, including: residual networks, U-Nets, autoencoders, recurrent neural networks, and fully connected networks. Regularization layers, like batch normalization and dropout, can also be added.

The neural network may be generalized for different anatomies and anatomical planes, by extending the variety of anatomy in the training dataset. Because phase-contrast MRI for different anatomies varies in the size of the temporal domain, we can also train our network on a variety of levels of sparsity in the time domain.

The techniques may be extend to correct for eddy current induced phase artifacts by modeling and simulating the artifacts and retraining our model.

Similarly, the technique may be extended to address dephasing artifacts that occur low venc acquisitions when there is turbulent flow. Signal dephasing artifacts can be simulated by adding additional noise to the training data in regions with low magnitude signal.

REFERENCES

[1] C. Simopoulos and K. F. Ustuner, "Phase unwrapped velocity display for ultrasound medical imaging," U.S. Pat. No. 7,682,311, 23 Mar. 2010.
[2] H. Liu, X. Zhao, and X. Li, "Method and system for regional phase unwrapping with pattern-assisted correction," U.S. Pat. No. 9,897,433, 20 Feb. 2018.
[3] M. R. Lucas, "Method for phase unwrapping using confidence-based rework," U.S. Pat. No. 9,964,640, 8 May 2018.
[4] M. A. Gulsun, M.-P. Jolly, and C. Guetter, "Phase unwrapping in phase contrast MR imaging," U.S. Pat. No. 9,689,949, 27 Jun. 2017.
[5] Y. Ye and J. Zong, "Methods and apparatuses for phase unwrapping," U.S. Pat. 2018/0203087, 19 Jul. 2018.

References

[6] K. S. Nayak, J.-F. Nielsen, M. A. Bernstein, M. Markl, P. D. Gatehouse, R. M. Botnar, D. Saloner, C. Lorenz, H. Wen, B. S. Hu, F. H. Epstein, J. N. Oshinski, and S. V. Raman, "Cardiovascular magnetic resonance phase contrast imaging," J. Cardiovasc. Magn. Reson., vol. 17, no. 1, p. 71, December 2015.
[7] M. Jenkinson, "Fast, automated, N-dimensional phase-unwrapping algorithm," Magn. Reson. Med., vol. 49, no. 1, pp. 193-197, January 2003.
[8] L. Ying, "Phase unwrapping," in Wiley Encyclopedia of Biomedical Engineering, Hoboken, N.J., USA: John Wiley & Sons, Inc., 2006.
[9] M. Costantini, F. Malvarosa, F. Minati, L. Pietranera, and G. Milillo, "A three-dimensional phase unwrapping algorithm for processing of multitemporal SAR interferometric measurements," in IEEE International Geoscience and Remote Sensing Symposium, 2002, vol. 3, pp. 1741-1743.
[10] M. Loecher and D. B. Ennis, "Velocity reconstruction with nonconvex optimization for low-velocity-encoding phase-contrast MRI," Magn. Reson. Med., vol. 80, no. 1, pp. 42-52, July 2018.
[11] K. M. Johnson, "3D velocimetry phase unwrapping using block-wise classification with a shift variant fully 3D convolutional neural network," in ISMRM 26th Annual Meeting, 2018.
[12] A. Justice, "Phase unwrapping of 4D-flow MRI data with graph cuts," 2018.

[13] J. Cheng, Y. Mei, B. Liu, J. Guan, X. Liu, E. X. Wu, Q. Feng, W. Chen, and Y. Feng, "A novel phase-unwrapping method based on pixel clustering and local surface fitting with application to Dixon water-fat MRI," Magn. Reson. Med., vol. 79, no. 1, pp. 515-528, January 2018.

[14] M. Loecher, E. Schrauben, K. M. Johnson, and O. Wieben, "Phase unwrapping in 4D MR flow with a 4D single-step Laplacian algorithm," J. Magn. Reson. Imaging, vol. 43, pp. 833-842, 2016.

[15] M. Untenberger, M. Hüllebrand, L. Tautz, A. A. Joseph, D. Voit, K. D. Merboldt, and J. Frahm, "Spatiotemporal phase unwrapping for real-time phase-contrast flow MRI," Magn. Reson. Med., vol. 74, no. 4, pp. 964-970, October 2015.

[16] E. Barnhill, P. Kennedy, C. L. Johnson, M. Mada, and N. Roberts, "Real-time 4D phase unwrapping applied to magnetic resonance elastography," Magn. Reson. Med., vol. 73, no. 6, pp. 2321-2331, June 2015.

[17] J. Langley and Q. Zhao, "A model-based 3D phase unwrapping algorithm using Gegenbauerpolynomials," Phys. Med. Biol., vol. 54, no. 17, pp. 5237-5252, September 2009.

[18] H. Bagher-Ebadian, Q. Jiang, and J. R. Ewing, "A modified Fourier-based phase unwrapping algorithm with an application to MRI venography," J. Magn. Reson. Imaging, vol. 27, no. 3, pp. 649-52, March 2008.

[19] M. F. Salfity, J. M. Huntley, M. J. Graves, O. Marklund, R. Cusack, and D. A. Beauregard, "Extending the dynamic range of phase contrast magnetic resonance velocity imaging using advanced higher-dimensional phase unwrapping algorithms," J. R. Soc. Interface, vol. 3, no. 8, pp. 415-27, June 2006.

[20] Q.-S. Xiang, "Temporal phase unwrapping for cine velocity imaging," J. Magn. Reson. Imaging, vol. 5, no. 5, pp. 529-534, September 1995.

[21] J. N. Ongori, E. M. Meintjes, and B. S. Spottiswoode, "3D phase unwrapping of DENSE MRI images using region merging."

[22] K. He, X. Zhang, S. Ren, and J. Sun, "Deep residual learning for image recognition," December 2015.

[23] D. C. Ghiglia and M. D. Pritt, Two-dimensional phase unwrapping: theory, algorithms, and software, 1st ed. New York [etc.]: John Wiley & Sons, Inc., 1998.

The invention claimed is:

1. A method for phase contrast magnetic resonance imaging (MRI), the method comprising:
acquiring phase contrast 3D spatiotemporal MRI image data;
inputing the 3D spatiotemporal MRI image data to a three-dimensional spatiotemporal convolutional neural network to produce a phase unwrapping estimate;
generating from the phase unwrapping estimate an integer number of wraps per pixel;
combining the integer number of wraps per pixel with the phase contrast 3D spatiotemporal MRI image data to produce final output.

* * * * *